United States Patent [19]

Kawamura et al.

[11] Patent Number: 5,115,561
[45] Date of Patent: May 26, 1992

[54] METHOD OF SPOT-FACING PRINTED CIRCUIT BOARD

[75] Inventors: Masahiro Kawamura, Kawasaki; Tamio Otani, Hadano; Masao Nishigai, Ayase, all of Japan

[73] Assignee: Hitachi Seiko, Ltd., Japan

[21] Appl. No.: 625,451

[22] Filed: Dec. 11, 1990

[51] Int. Cl.$^5$ .............................................. H05K 3/00
[52] U.S. Cl. .................................. 29/829; 29/426.4; 29/825; 156/901
[58] Field of Search ........... 29/825, 829, 33 M, 426.4; 156/901

[56] References Cited

U.S. PATENT DOCUMENTS 4,588,468  5/1986  McGinty et al. ............... 156/901 X

FOREIGN PATENT DOCUMENTS

| 108254 | 5/1984 | European Pat. Off. ............ 29/825 |
| 60-38291 | 11/1985 | Japan . |
| 61-131804 | 6/1986 | Japan . |
| 223544 | 3/1958 | United Kingdom ................. 29/825 |

Primary Examiner—Carl J. Arbes
Attorney, Agent, or Firm—Evenson, Wands, Edwards, Lenahan & McKeown

[57] ABSTRACT

A printed circuit board having a substrate on which circuitry is formed, is spot-faced, by cutting at first the circuitry, and then by spot-facing the substrate up to a desired depth.

3 Claims, 2 Drawing Sheets

METHOD OF SPOT-FACING PRINTED CIRCUIT BOARD

BACKGROUND OF THE INVENTION

The present invention relates to a method of spot-facing a printed board.

A printed circuit board used in an IC card or the like is spot-faced, and a part of an electronic part is sunk in the printed circuit board so as to make the IC card or the like thin and to enhance the reliability of the attachment of the electronic part.

The method for spot-facing a printed circuit board, as mentioned above, is conducted with the use of an end-mill or other special purpose machine tools after the steps of drilling, plating and etching for preparing a desired circuit being carried out. Then, as shown FIGS. 3A and 3B circuitry 2 formed on a substrate of the printed circuit board P is extended in part into an area 3 to be spot-faced but a machining error is inevitably built up before the spot-facing process.

Accordingly, in the spot-facing process for the printed circuit board P, not only the circuit board 1 but also the circuitry 2 is cut and removed within the area 3 to be spot-faced so as to form a spot-face 4.

Further, during the spot-facing process, as shown in FIG. 5, when the circuitry 2 within the area 3 to be spot-faced is cut, the width w of the circuitry 2 becomes narrower and narrower as a tool 5 is advanced. Then, the pressing force of the tool 5 becomes larger than the bonding force of the circuitry 2 which therefore peels off from the substrate 1 so as to form burrs, these burrs being left on the circuit board 1, causing a short-circuit between the circuitry 2.

In order to solve such a problem, it has been proposed to cover an area to be spot-faced and an area therearound on a printed circuit board with synthetic resin before carrying out spot-facing process. With this process, the bonding force between the substrate 1 and the circuitry 2 is strengthened, and accordingly, occurrence of burrs can be eliminated.

However, the above-mentioned spot-facing process using synthetic resin for covering an area to be spot-faced, requires extra steps of, such as, coating the area with synthetic resin, drying the synthetic resin, removing the resin after completion of the spot-facing step, and drying the area, and the like, and accordingly, not only the workability is lowered but also machines and tools necessary for these respectively steps are prepared.

SUMMARY OF THE INVENTION

The present invention has been made in view of the above-mentioned problems inherent to the prior art spot-facing method, and accordingly, one object of the present invention is to provide a method of spot-facing a printed circuit board in which occurrence of burrs can be prevented.

To the end, according to the present invention, there is provided a method of spot-facing a printed circuit board having a substrate and circuitry formed on the substrate, comprising, a first step of cutting and removing circuitry within an area to be spot-facing, and a second step of spot-facing the substrate.

That is, the substrate is spot-faced up to a desired depth at the second step after the circuitry has been cut and removed in part within the area to be spot-faced.

Thus, since the spot-facing process is composed of first and second steps which are independent from each other, that is, since the circuitry is beforehand removed at the first step, the pressing force of a tool against the circuitry is decreased at the second step of spot-facing the substrate, and accordingly, it is possible to prevent the circuitry from peeling off from the substrate, thereby making it possible to eliminate occurrence of burrs.

Other features, objects and advantages of the present invention will become apparent from the following specification when read in connection with the accompanying drawing in which:

DETAILED DESCRIPTION OF PREFERRED EMBODIMENTS

Figure 1A:
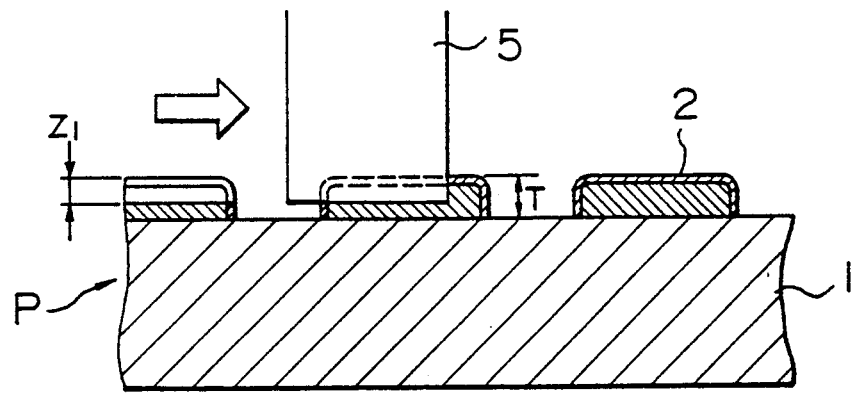
FIGS. 1A and 1B are views for explaining a spot-facing method, in one example, according to the invention.
Figure 1B:
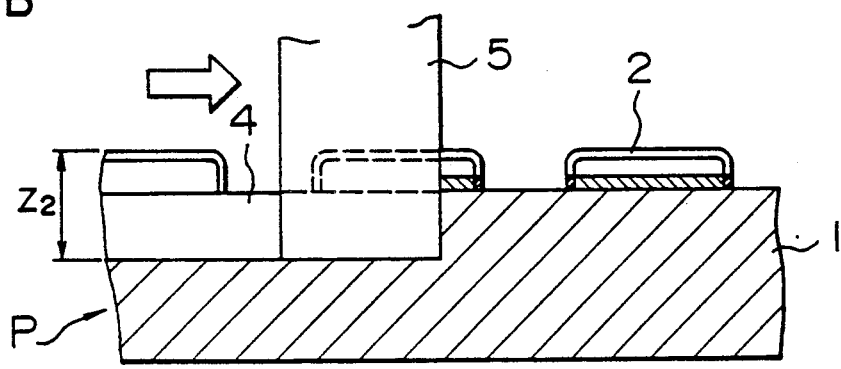

Referring to FIGS. 1A and 1B, there is shown a printed circuit board P comprising a substrate 1 on which circuitry 2 is formed. A spot-face 4 is formed in the printed circuit board P with the use of a spot-facing tool 5 while the printed circuit board P and the tool 5 being displaced so as to carry out a desired process under the control of an NC machine.

With this arrangement, the circuitry 2 is cut within an area to be spot-faced, up to a cut depth Z1 which is a one-half to two-third of a thickness T of the circuitry 2 by the tool 5.

Then, the substrate 1 and the circuitry 2 are cut by the tool 5 up to a cut depth Z2 which corresponds to a desired spot-facing depth.

As mentioned above, since the circuitry is cut until its thickness becomes less than one-half of the thickness T thereof before spot-facing the substrate 1, a cutting resistance exerted to the circuitry 2 becomes smaller during spot-facing the substrate 1, and accordingly, it is possible to prevent the circuitry 2 from peeling off from the substrate 1.

Thus, it is possible to prevent occurrence of burrs which has been conventionally caused by peeling-off of the circuitry.

Figure 2:
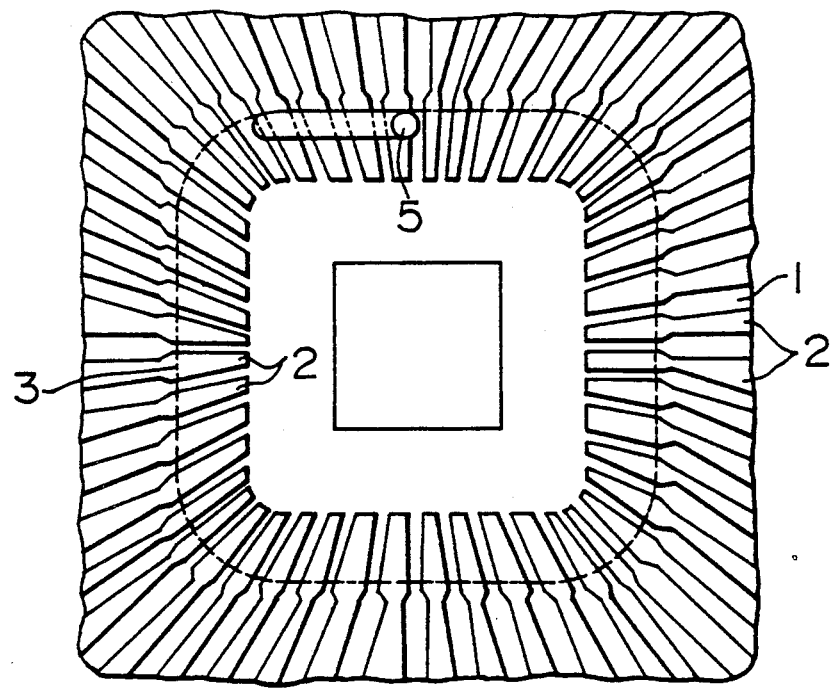
FIG. 2 is a plan view illustrating another embodiment of the present invention.

Referring to FIG. 2 in which like reference numerals are used to denote like parts to those shown in FIGS. 1A and 1B; reference numeral 3 denotes an area to be spot-faced.

Further, the circuitry 2 is cut in only the inner peripheral part of the area 3 to be spot-faced similar to the above-mentioned first embodiment, and thereafter, the substrate 1 is spot-faced.

Even with the above-mentioned spot-facing method, technical effects and advantages which are similar to those explained in the first embodiment can be obtained.

Figure 3A:
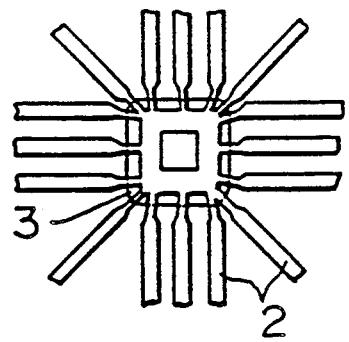
FIGS. 3A and 3B are plan and transverse sectional views, respectively, illustrating a part to be spot-faced of a printed circuit board.
Figure 4A:
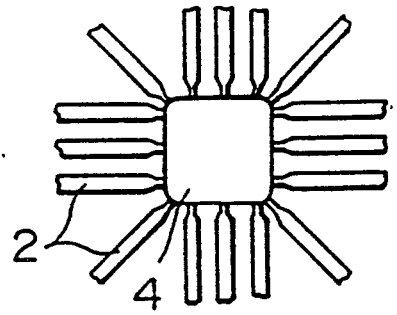
FIGS. 4A and 4B are plan and transverse sectional views, respectively, illustrating the same part as shown in FIGS. 3A and 3B, after completion of the spot-facing method.
Figure 3B:
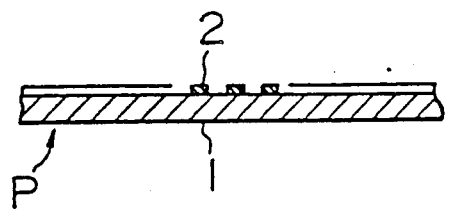
Figure 4B:
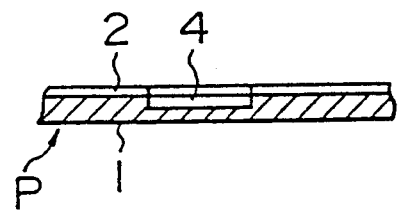
Figure 5:
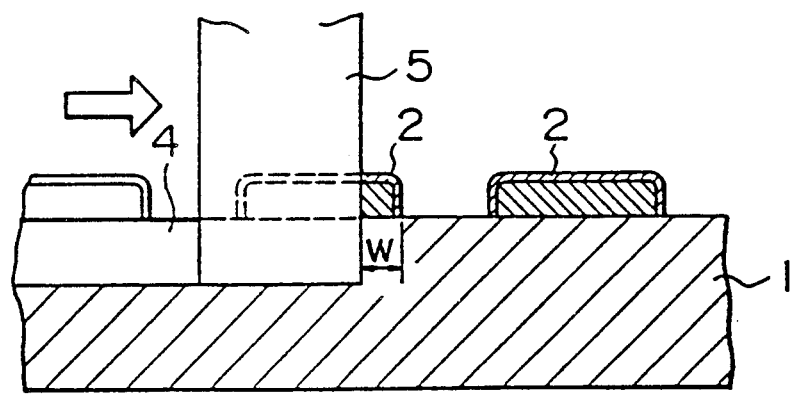
FIG. 5 is a transverse sectional view illustrating a conventional spot-facing method.

Incidentally, FIGS. 3A and 3B show the printed circuit board P before spot-facing while FIGS. 4A and 4B show the printed circuit bore P after completion of the spot-facing.

As mentioned above, according to the present invention, the substrate is spot-faced after the circuitry has been cut, and therefore, it is possible to prevent occurrence of burrs.

What we claim is:

1. A method of spot-facing a printed circuit board having a substrate and circuitry with a thickness formed on said substrate, within an area to be spot-faced, in which said circuitry is partially included, comprising the steps of:

cutting and removing a portion of said thickness of said circuitry within said area to be spot-faced; and, thereafter, spot-facing said substrate to a desired depth thereof.

2. The method as set forth in claim 1, wherein said circuit elements are at first cut by one-half to two-third of a thickness of said circuitry thickness, and then said substrate is spot-faced up to a desired depth thereof.

3. A method of spot-facing a printed circuit board having a substrate and circuitry with a thickness formed on said substrate, within an area to be spot-faced having an outer peripheral portion, in which said circuitry is partially included, comprising the steps of:

cutting a portion of said thickness of said circuitry within said area to be spot-faced along said outer periphery; and spot-facing said substrate to a desired depth thereof.

* * * * *